United States Patent

Canning et al.

[15] 3,641,661

[45] Feb. 15, 1972

[54] METHOD OF FABRICATING INTEGRATED CIRCUIT ARRAYS

[72] Inventors: Michael Leo Canning; Roger Stanley Dunn; Gerald Embry Jeansonne, all of Richardson, Tex.

[73] Assignee: Texas Instruments Incorporated, Dallas, Tex.

[22] Filed: June 25, 1968

[21] Appl. No.: 739,869

[52] U.S. Cl. ....................29/574, 29/577, 29/593

[51] Int. Cl. ....................B01j 17/00, H01l 7/00

[58] Field of Search ....................29/574, 577, 578, 589, 593; 317/235

[56] References Cited

UNITED STATES PATENTS

| | | | |
|---|---|---|---|
| 3,128,332 | 4/1964 | Burkig et al. | 29/577 UX |
| 3,290,557 | 12/1966 | Ayer | 29/577 UX |
| 3,312,871 | 4/1967 | Seki et al. | 29/577 UX |
| 3,377,513 | 4/1968 | Ashby et al. | 29/577 UX |
| 3,423,822 | 1/1969 | Davidson et al. | 29/577 UX |
| 3,553,830 | 1/1971 | Jenny et al. | 29/574 |

*Primary Examiner*—John F. Campbell

*Assistant Examiner*—W. Tupman

*Attorney*—Samuel M. Mims, Jr., James O. Dixon, Andrew M. Hassell, Harold Levine, Melvin Sharp, Gerald B. Epstein and John E. Vandigriff

[57] ABSTRACT

A large number of integrated circuits are formed on a semiconductor substrate. Conductive feedthrough connections are made through an insulating layer deposited over the integrated circuits and then the functional characteristics of the circuits are determined by testing at the feedthrough connections. Only the feedthrough connections connected to circuits having desirable functional characteristics are interconnected to provide the desired system function.

3 Claims, 9 Drawing Figures

METHOD OF FABRICATING INTEGRATED CIRCUIT ARRAYS

This invention relates to semiconductor devices, and more particularly to the fabrication of complex electrical circuitry in microminiature form.

A great deal of effort is currently being devoted to the fabrication of integrated circuit arrays having high component density in order to reduce the required number of integrated circuit packages per system, thereby increasing system reliability and reducing system cost, size and weight. It has been found that very high component density may be obtained by forming a large number of integrated circuits on a single monocrystalline silicon slice having a diameter of perhaps 1 ½ inch. Each of these integrated circuits performs a preselected circuit function and may contain perhaps 20 or more components such as transistors, resistors, and the like. An entire system function may thus be provided upon a single semiconductor slice.

As the required number of circuits to be fabricated upon a single semiconductor slice increases, the complexity of the crossovers between the circuits increases to the point where multilevel metallization is necessary. Several different techniques have heretofore been developed for the fabrication of multilevel, high-density integrated circuit arrays. One technique, often termed the 100 percent yield approach, interconnects components on a slice with a first level of metallization to form a large number of unconnected circuit functions. A second layer of metallization is then applied to interconnect the circuit functions to provide a system function. When the fabrication is complete, testing of the circuit and system functions is carried out. If one or more circuits are bad, the entire array is useless and must be discarded.

A second technique commonly termed "discretionary wiring" also interconnects groups of circuits or cells with multilevel metallization to provide a number of complex functions on a single semiconductor slice. However, with this technique each circuit or cell is tested prior to interconnection to form a system function, and only the "good" circuits are connected and used in the final system array. Discretionary wiring eliminates the loss of an entire array due to a few bad cells, and thus greatly increases the yield of usable slices. A disclosure and description of the discretionary wiring technique is found in *Electronics*, Feb. 20, 1967, pgs. 143–154; and in U.S. Pat. application Ser. No. 420,031, filed Dec. 21, 1964, now abandoned; and the copending U.S. Pat. application Ser. No. 645,539, filed June 5, 1967.

Basically, the discretionary wiring technique heretofore practiced has comprised diffusing a silicon slice with doping impurities to form a large number of unconnected components. Fixed leads are then deposited and etched on the slice to connect groups of components in a predetermined manner to provide the desired circuit functions. An automatically stepped multipoint probe is then controlled by a computer to sequentially test each of the connected cells. The multipoint probe tests each of the cells for predetermined circuit functions, and stores the resulting test information on magnetic tape for processing in a high-speed computer. The computer generates a discretionary interconnection pattern which bypasses defective cells on the slice as determined by the multipoint probe, and connects only "good" cells. This interconnection pattern is input into an automatic mask generation system which controls the deflection of a cathode-ray tube beam directed upon a film strip. A mask image is generated on the film by incrementally exposing small spots on the film with the cathode-ray tube beam based upon the data fed from the computer.

A layer of insulation is then deposited over the cells, and feedthrough holes are etched over each of the cells utilizing a fixed standard mask. Then utilizing a unique mask prepared by the mask generation system, second level leads are etched to connect only those feedthrough holes which connect with the "good" cells. The resulting interconnected cells are then tested to assure that they perform the desired system functions.

While this discretionary wiring technique is advantageous in providing a very high level of circuit integration, problems have sometimes arisen due to the fact that defects occur in the process steps conducted after the testing of the first metallization level cells. For instance, the oxide insulating layer applied over the connected first metallization level cells is often not perfect, and shorts between the multilevel lead connections may exist through the oxide layer. Further, problems sometimes arise in etching the feedthrough holes completely through the oxide layer, thereby creating open circuits. Such second metallization level defects may sometimes be serious enough to render an entire array unusable, thereby wasting the complex testing and discretionary wiring techniques used to fabricate the slice.

In accordance with the present invention, yield losses in a major part of the insulation and in the second metallization level of an integrated circuit are determined before the cells in the first metallization level are connected by discretionary wiring. Specifically, the cells are formed on the semiconductor substrate in the manner previously described. An oxide layer is formed over the cells and conductive feedthrough connections are formed through the oxide layer of the cells. The feedthrough connectors are then tested to determine the validity of the feedthrough connections and also to determine the circuit functions of the cells. If a substantial part of the circuit array is defective, this testing allows the entire circuit array to be discarded at a stage in the fabrication process before expensive computer computation and discretionary mask fabrication. If only a relatively small number of cells are defective, only the "good" feedthrough connections are then interconnected according to a discretionary wiring process to provide a usable system array. Additionally, fixed lead patterns other than the feedthrough connections are tested by the invention to determine whether the fixed leads are available for use for second level interconnection. For a more complete understanding of the present invention and other objects and advantages thereof, reference is now made of the following description taken in conjunction with the accompanying drawings in which:

FIG. 1 discloses a somewhat diagrammatic top view of three 16-bit word sections taken from a complex integrated circuit memory system and shown in the first metallization layer stage of fabrication;

Figures 1, 3, 4:
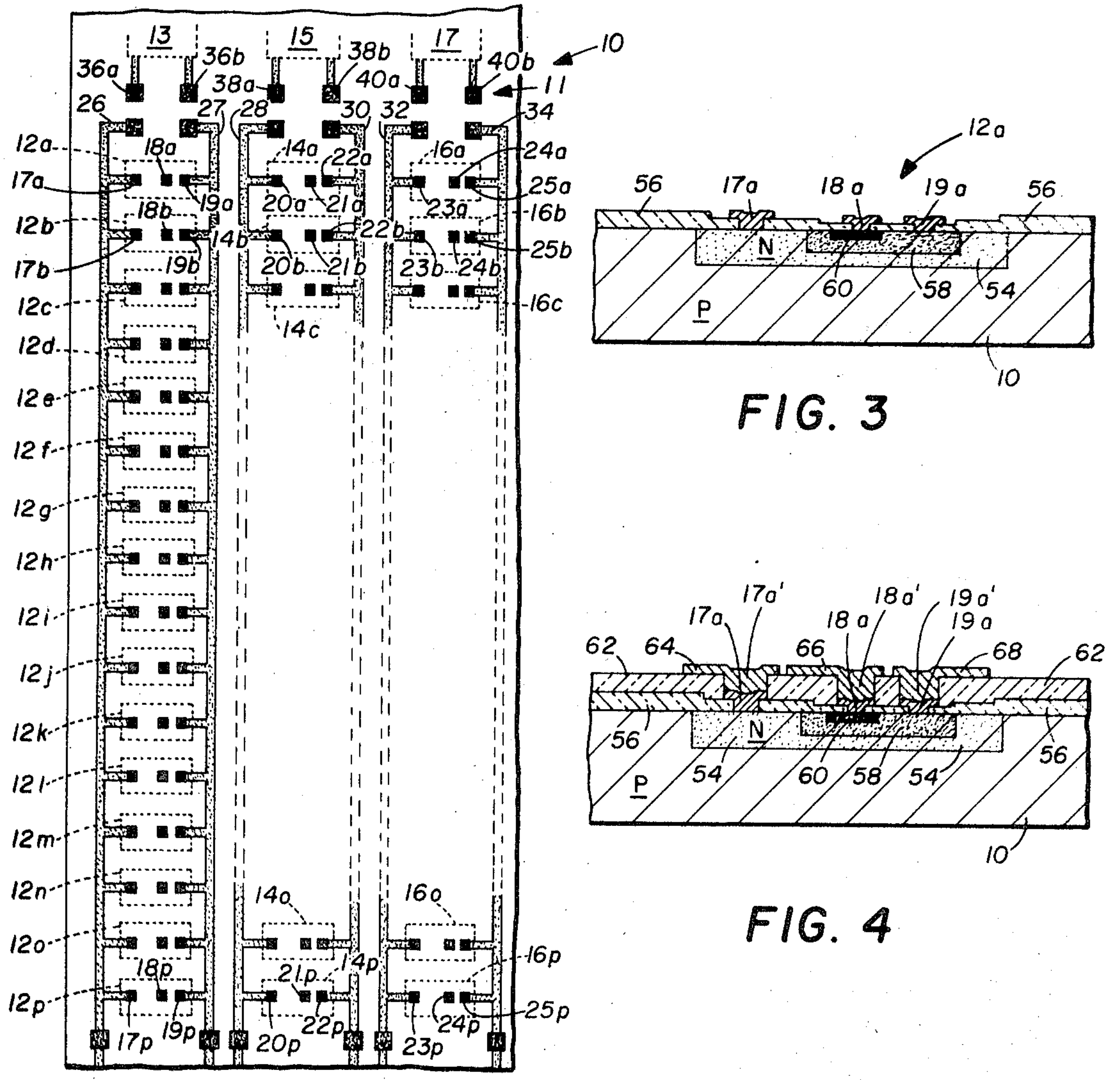
FIG. 3 is a sectional view of an integrated circuit transistor of the type utilized in the memory system of FIG. 1.
FIG. 4 is a sectional view of the integrated circuit transistor of FIG. 3 with a second metallization layer added.
Figure 8:
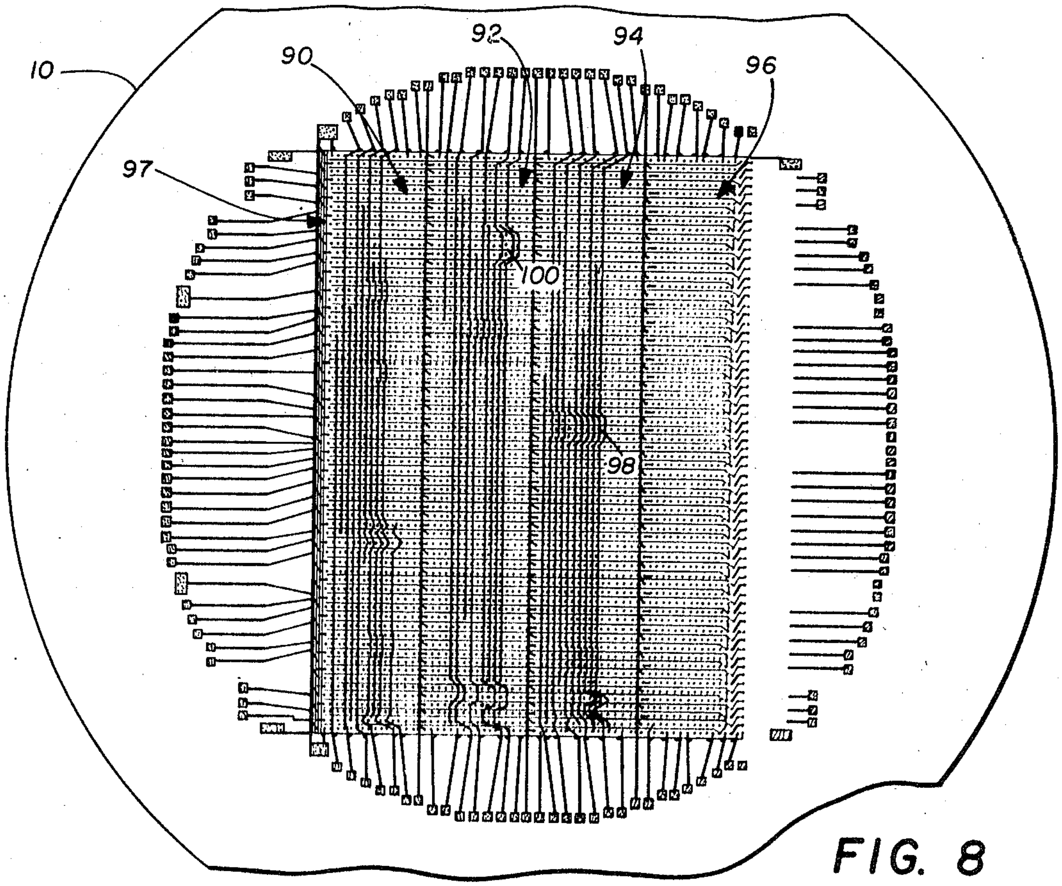
Figure 9:
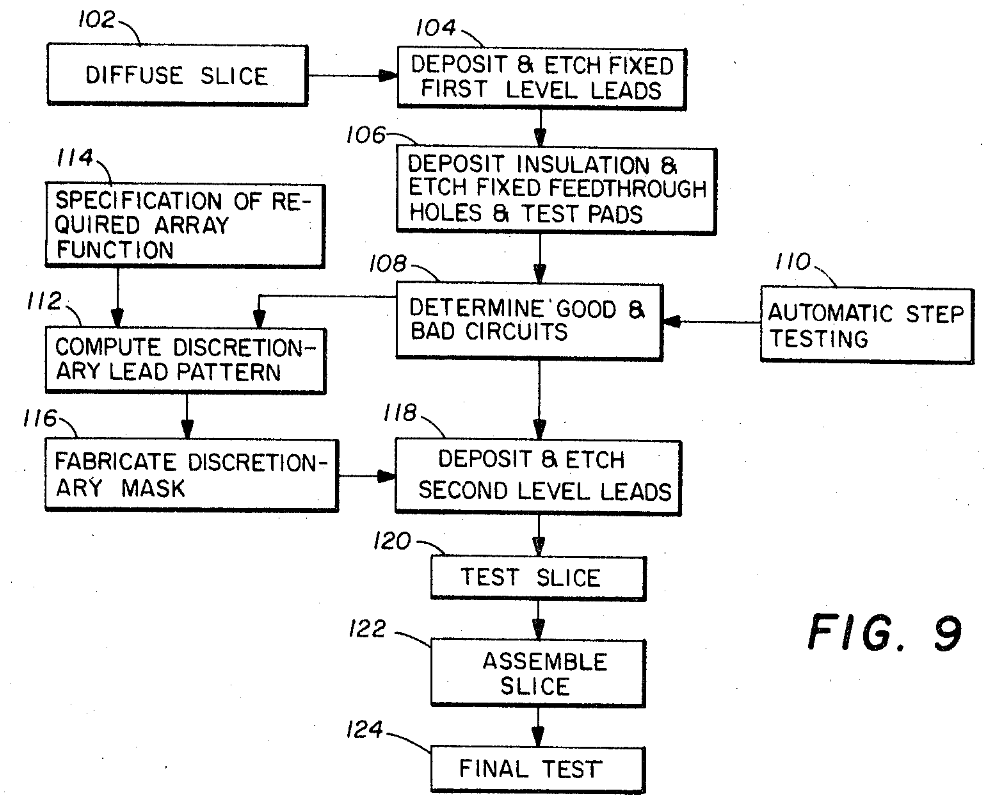

FIG. 8 is an enlarged top view of the entire memory system illustrating the discretionary wiring according to the invention; and FIG. 9 is a block diagram illustrating the fabrication steps of the invention Referring to the drawings, FIG. 1 illustrated a greatly enlarged portion of a wafer, or slice, 10 of semiconductor material which includes a large number of functional circuits, in this case memory cells, 12*a–p*, 14*a–p*, and 16*a–p*. For simplicity of illustration cells 14*d–n*, and 16*d–n* have been omitted from the drawings. The illustrated cells are only a portion of the total memory system array shown in FIG. 8, to be later described, which may be seen to be arranged in four sections. Each of the sections contains 60 rows of 16 memory cells. The rows of each section are aligned so that if all the sections are connected in series, 60 rows of 64 memory cells results.

The portion of the system shown in FIG. 1 comprises only three rows of 16 cells, each row capable of providing a 16-bit word. Located on the wafer 10 in an area separated from the four sections of the memory array by an interconnection area 11 are 60 word driver circuits, one word driver circuit being provided for each aligned row of 64 memory cells. In FIG. 1, word driver circuits 13, 15 and 17 are illustrated.

Each of memory cells 12*a–p*, 14*a–p* and 16*a–p* are identical and comprise a single integrated circuit transistor. The transistor cells 12*a–p* have collectors 17*a–p*, emitters 18*a–p* and bases 19*a–p* (only certain of the transistor cells being so numbered for ease of illustration). Similarly, transistor cells 14*a–p* include collectors 20*a–p*, emitters 21*a–p* and bases 22*a–p*. Transistor cells 16*a–p*, likewise include collectors 23*a–p*, emitters 24*a–p* and bases 15*a–p*. Each of the collectors 17*a–p* are interconnected by a metallized lead 26, while each of the bases 19*a–p* are connected in series by a metallized lead 27. The collectors 20*a–p* of the memory cells 14*a–p* are connected in series by a metallized lead 28, and the bases 22*a–p* are connected in series by a metallized lead 30. A metallized lead 32 connects in series the collectors 23*a–p* of the memory cells 16*a–p* and a metallized lead 34 connects in series the bases 25*a–p*.

The word driver circuit 13 has two outlet terminals 36*a* and 36*b*, which in the first metallization layer stage of assembly of the present array, are not connected to the metallized leads 26 and 27. Similarly, the word driver circuit 15 includes two output terminals 38*a* 38*b* which are also not connected with metallized leads 28 and 30. The word driver circuit 17 includes a pair of output terminals 40*a* and 40*b* which are not connected to the metallized leads 32 and 34 at the first metallization layer of the system. As will later be described, suitable connections between the word driver circuits and the memory arrays are made at the second level metallization.

Figure 2:
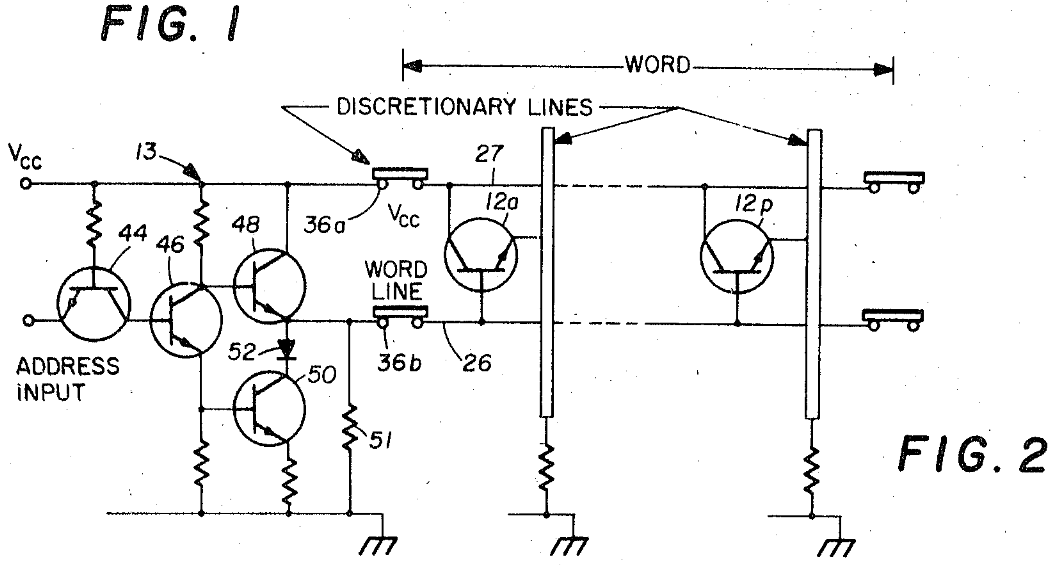
FIG. 2 is a schematic illustration of one of the 16-bit word sections shown in FIG. 1.

FIG. 2 illustrates in schematic detail the construction of the word driver circuit 13 and the series-connected memory transistors 12*a–p*, the majority of the memory transistors not being shown for ease of illustration. The word driver circuit 13 comprises an input transistor 44, having its emitter connected to the address input. The address input is fed through transistor 44 to the base of an amplifier transistor 46. Transistor 48 and 50 are connected in series across transistor 46. When the input of an address is high, the transistor 50 is saturated and transistor 48 is cut off. Word line lead 26 is held close to ground potential by resistor 51, thereby cutting off all the memory transistors 12*a–p* and holding diode 52 in a nonconductive state. Upon the input of an address to transistor 44, the transistor 50 is turned off and the transistor 48 is turned on. The voltage applied to lead 26 then is raised to increase the voltage to the transistors 12*a–p* and thus to select the word line.

The memory transistors 12*a–p* are connected in emitter-follower configurations, with the transistor bases tied to the word line lead 26. The emitters of the transistors 12*a–p* are not connected in the first metallization layer application stage, as previously noted, but are later connected by discretionary second metallization layer lines shown in FIG. 2. Detectors (not shown) are provided on another separate array to sense the logic memory provided by the interconnected memory transistors.

In practice of the invention, a number of redundant, or unnecessary, cells are provided in each of the memory cell word lines. For instance, if a 13-bit word is required from each section of the array, only 13 "good" word bits are required from the 16 bits in each row of 16 memory cells. Hence, it is not necessary for all 16 memory cells 12*a–p* to be "good" in order to allow the slice 10 to be usable, but it is necessary for 13 cells in the necessary number of rows to be "good". These "-good" thirteen cells in each row are interconnected by discretionary wiring on a second metallization layer in a manner to be subsequently described. The provision of the redundant cells enables one basic slice to be interconnected in a variety of ways to provide different system functions.

FIG. 3 illustrates a greatly enlarged plan view of one of the memory transistors on the wafer 10, all of the memory cells being identical in this example. As is known, these transistors are extremely small, and are barely discernable to the naked eye. For instance, the wafer 10 itself will generally have a diameter of about 1½ inch. The memory transistors may be formed according to the well-known technique of isolating epitaxial slices. A N-type epitaxial area 54 is defined in the P-type substrate 10, which may be, for instance, P-type silicon. A metal contact 17*a* extends through an insulating coating 56 which is typically silicon oxide, to define the collector of the transistor. A P-type diffused region 58 is contacted by a metal contact 19*a* to define the base of the transistor. An N-type diffused region 60 is contacted by a metal contact 18*a* to define the emitter of transistor.

As previously noted, methods for fabricating such transistors on semiconductor substrates are well known, and are for instance described in greater detail in the co-pending U.S. Pat. application Ser. No. 645,539. Further, for a detailed description of the fabrication of such integrated circuits, reference is made to *Integrated Circuits*, by Baum et al., McGraw-Hill Book Company, 1965, pgs. 127–165, and other pertinent pages therein.

It will be understood that the memory circuits presently disclosed are chosen merely for illustrative purposes, and any one of a number of different functional systems may be constructed by the present method. Further, the invention is not limited to any specific integrated circuit construction. For instance, each of the cells may comprise several transistors and various components such as resistors and capacitors. An example of such a circuit is found in the copending U.S. Pat. application Ser. No. 645,539. Instead of the epitaxial fabrication technique previously described, the cells may be made by multiple diffusion steps or by any other fabrication technique.

Further, the PN junctions used to isolate the components may be replaced by dielectric barriers. Other active elements, such as junction-type field-effect transistors, insulated gate field-effect transistors, thin film devices and the like, may be employed in place of the transistors illustrated. While silicon is given as an example of semiconductor material used, other semiconductors such as germanium or the well-known III–V compounds may for many instances be equally suitable. The water 10, instead of comprising a monocrystalline extrinsic substrate, may instead comprise a polycrystalline, intrinsic, or semiinsulating in character.

Referring again to FIGS. 1 and 3, the first metallization layer is shown as being completed with the word driver circuits 13, 15 and 17 defined on the water 10, along with the 16-bit word arrays 12*a–P*, 14*a–p* and 16*a–p*. At this first metallization level stage of fabrication, previous methods, such as disclosed in U.S. Pat. application Ser. No. 645,539, have required the performance of extensive testing steps. However, the present invention postpones testing until after the application of a second layer metallization test pattern. FIG. 4 illustrates the second layer metallization test pattern according to the present invention. A layer of oxide insulation 62 is deposited over the exterior surface of the circuit array. A photoresist layer is then applied over the insulation by conventional technique and is patterned by exposure through a suitable photomask having a preselected fixed pattern. This fixed pattern exposes areas overlying terminals of the first metallization layer, such as the three terminals of each of the memory transistors. The photoresist layer is exposed by light projected through the mask and then is developed by spraying the slice with suitable developing solution. The slice is then immersed in a suitable etching solution, such as buffered hydrofluoric acid, to etch openings through the insulation layer to the selected terminals of the first metallization layer. The remaining photoresist is then stripped from the wafer and a layer of metal is deposited over the oxide layer. Again, using conventional etching techniques, portions of the metal layer are etched away to leave only the desired feedthrough connections illustrated in FIGS. 4 and 5.

Referring to FIG. 4, metallized feedthrough connections 17*a*′, 18*a*′ and 19*a*′ are formed on the transistor memory cell 12*a* in contact with the first metallization layer terminals 17*a*, 18*a* and 19*a*. It should be noticed that it is very important that the feedthrough connections extend completely through the oxide layer 62 for contact with the respective metal contacts 17*a*, 18*a* and 19*a*.

Figure 5:
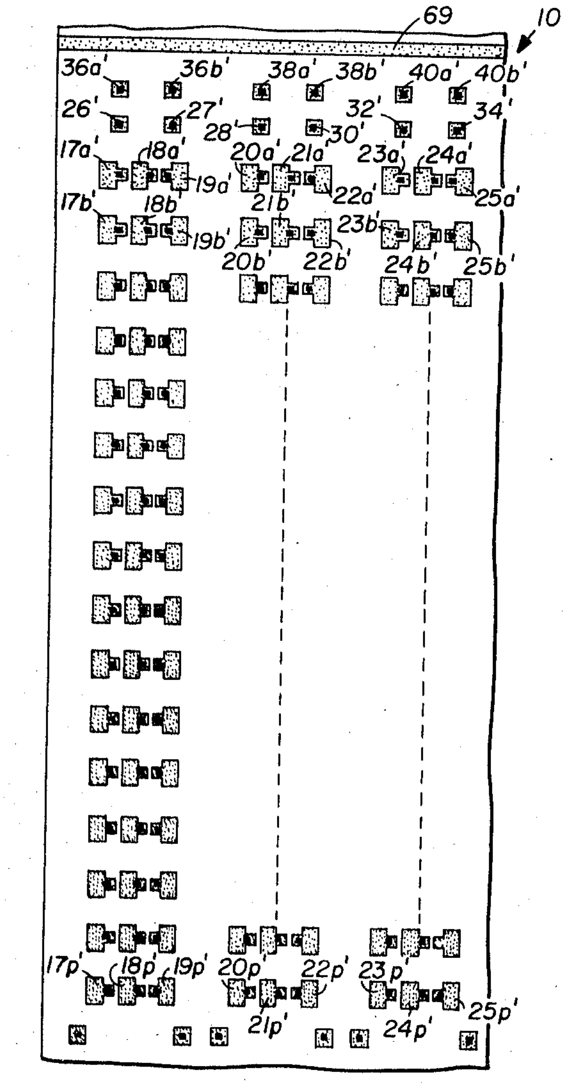
FIG. 5 is a diagrammatic top view of the integrated circuit word sections of FIG. 1, with a second metallization layer applied thereto.

Referring to FIG. 5, a top view of the second metallization layer on the wafer 10 is illustrated. In order to facilitate the reading of the drawings, primes of the numerals referring to the first metallization layer are used to designate corresponding portions of the second metallization layer. For instance, second metallization layer feedthrough contacts 36*a*′ and 36*b*′ extend through the oxide layer into contact with the terminals 36*a* and 36*b* of the word driver circuit 13. Similarly, second metallization layer contacts 38*a*′ and 38*b*′ and 40*a*′ and 40*b*′ are deposited through the oxide layer into contact with contacts 38*a*, 38*b*, 40*a* and 40*b*, respectively. Second metallization layer contacts 26′–34′ extend through the oxide layer into contact with the leads 26–34 shown in FIG. 1.

A second metallization layer contact is also provided for each of the three terminals of the memory cells shown in FIG. 1. For example, the feedthrough contacts 17*a*′–*19a*′ extend through the oxide layer into electrical contact with the metal contacts 17*a*–*19a* of the cell 12*a*. Similarly, second metallization layer contacts 20*a*′–*22a* ′ and 23*a*′–*25a*′ extend through the oxide layer into contact with the respective metal terminals of cells 14*a* and 16*a* (FIG. 1). Similar second metallization layer feedthrough contacts are provided for each of the memory cells shown in FIG. 1. For ease in illustration, certain of the second metallization layer contacts have been omitted from FIGS. 5 and 7.

From an inspection of the shape of the second metallization layer feedthrough contacts, it will be seen that each contact comprises a feedthrough area and a test pad area. FIG. 4 best illustrates the configurations of the contacts, with the feedthrough portions shown as 17*a*′, 18*a*′ and 19*a*′, while the enlarged test pad areas are designated as 64, 66 and 68. The test pad areas are provided to allow test probing of the second metallization layer to determine which of the memory transistors meet preselected electrical requirements. The test pads are necessary so that the test probes do not damage the delicate feedthrough portions of the contacts.

A fixed lead 69 is also formed at the fabrication stage shown in FIG. 5. Lead 69 is a power lead, and normally a number of similar leads will be formed in fixed positions at the second metallization layer. These leads are tested according to the procedure to be described in order to determine the electrical continuity of the leads and to detect shorts between the leads and other portions of the array. If a lead tests defective, another lead is utilized, or the defective lead is broken into continuous segments and utilized.

The testing of the second metallization layer is conducted in generally the same manner as the first level testing described and disclosed in U.S. Pat. application Ser. No. 645,539. The testing is accomplished by engaging the test pads of the three feedthrough connections of a transistor memory cell with a multiprobe structure. Certain of the probes are provided with electrical input signals, with others of the probes detecting output signals. The detected signals provide an indication of the electrical characteristics of the memory transistors. In this instance, each of the transistors are tested for their ability to represent a logic "1," as well as for leakage current and the like. Additionally, the tests determine the validity of the feedthrough connections to the second metallization layer, thus determining defects in the walls of the feedthrough connections and the like. Further, in some instances, certain of the probes will test for shorts in the oxide layer between the two metallization layers.

Figure 6:
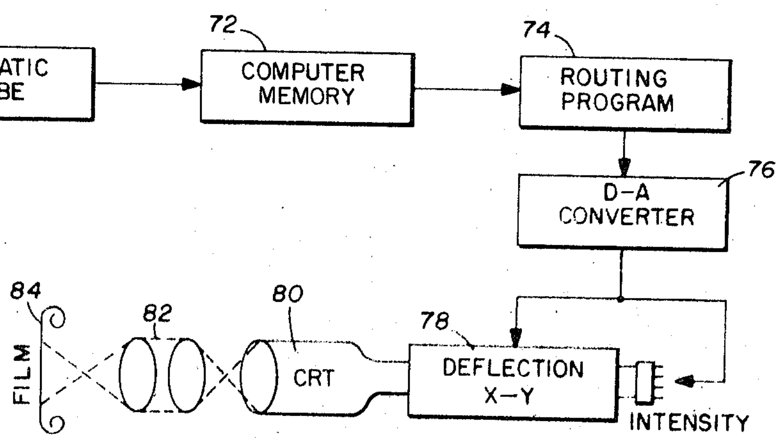
FIG. 6 is a block diagram of the multilevel interconnection generator used in the invention.

FIG. 6 illustrates a system for performing the automatic testing and fabrication of of the second metallization layer discretionary mask. The testing is conducted by precisely placing the semiconductor wafer and optically aligning the multiprobe system on an initial cell. The slice is then automatically indexed with respect to the multiprobe system until all of the cells are tested. This probing system, designated as the automatic probe 70, thus sequentially determines whether the memory cells of the array are good or bad, with the resulting data being supplied to a computer memory 72. The data as to the validity of each of the memory cells is generally stored at memory 72 on magnetic tape. This magnetic tape is fed into a routing program digital computer 74, which generates a slice map showing the locations of good and bad memory circuits.

This slice map is then transmitted by the computer 74 into a digital routing pattern of interconnections, so that a selected number of good circuits are connected to form the desired system function. The resulting digital routing pattern is converted into analog signals by a digital-to-analog converter 76. The analog signals control the deflection and intensity circuitry 78 of a cathode-ray tube 80. The cathode-ray tube beam is passed through a lens system 82 so that a narrow light beam is directed upon a suitable photographic film or plate 84.

By controlling the deflection and intensity of the light beam from the cathode-ray tube 80, a mask image is generated on the film 84 due to the incremental exposure of small spots on the film. The mask generated by the system has lines which are as narrow as 1 mil, with 1-mill spaces in between the lines. The complete testing and mask-generating procedure may be accomplished in a relatively short time. For more detailed explanation and description of the system shown in FIG. 6, reference is made to the previously identified Feb. 20, 1967 article in *Electronics*.

After the film 84 has been exposed in accordance with the desired discretionary wiring interconnections for the second metallization layer, the film is developed. The slice shown in FIG. 5 is then deposited with a thin metal film, aluminum for example, and a photoresist to create the desired second metallization layer interconnection pattern. The form of this desired pattern will of course depend upon the results of the testing procedure. Since the probability is very small that the exact same pattern will be generated more than once when a large number of memory cells are present, the particular mask to be generated may be referred to as a unique mask.

Figure 7:
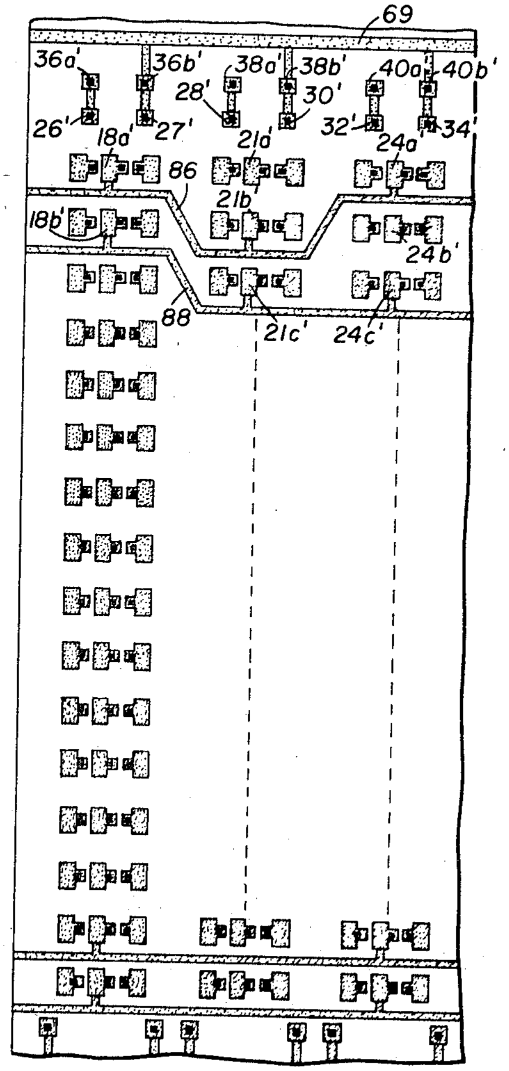
FIG. 7 is a somewhat diagrammatic top view of the integrated circuit array of FIG. 5, with the addition of discretionary interconnection leads formed according to the invention.

After the photoresist is exposed, it is developed and the excess metal film is removed by conventional etching steps. The resulting metallization is shown in FIG. 7, with the majority of the interconnection leads omitted for clarity of illustration. Referring to FIG. 7, it will be seen that some of the second metallization layer contacts have not been interconnected, as their respective memory cells were tested to be bad. Further, in this instance, only the emitters of valid cells are interconnected, although it will be understood that for many applications all terminals of a cell will be interconnected. The emitter contact 18*a*′of cell 12*a* is connected to a lead 86 which bypasses the contact 21*a*′of the memory cell 14*a*, but connects to the emitter contact 21*b*′of the memory cell 14*b*. Memory cell 14*a* in this case was determined to be bad. The lead then interconnects with the emitter contact 24*a*′of the memory cell 16*a*.

Similarly, a lead 88 connects with the emitter contact 18*b*′ and then connects with the emitter contacts 21*c*′ and 24*c*′ of the memory cells 14*c* and 16*c*. In this instance, the memory cell 16*b* was tested as bad and is therefore left unconnected. Similar connections are made on the wafer according to the unique mask. The term "discretionary wiring" is thus appropriate for this method, as cells which do not meet the desired electrical characteristic tests are omitted from the final interconnection pattern. It is important to note that the omission of cells which test bad is possible only by the provision of a redundant number of memory cells in the first metallization layer, thus allowing a certain number of the cells to be omitted from the final system connection.

Additionally, discretionary wiring lines interconnect word driver circuit terminals 36*a'* and 36*b'* with the terminals 26' and 27'. Similar connections are made for the output terminals of the other word drivers. In case one of the word driver circuits is determined to be bad, or if a large number of the cells in association with a particular word driver circuit are determined to be tested bad, discretionary connection lines are not being generated to connect up the particular word driver circuit.

After the second metallization layer of discretionary wiring is complete, the wafer is again tested and then packaged by securing the wafer onto a metallized pad on a ceramic base, and then bonding fine wires to the outer terminals of the system.

An illustration of a completed, but unpackaged, circuit array fabricated according to the invention is shown in FIG. 8. Four memory sections 90, 92, 94 and 96 are disposed on wafer 10, each section containing 60 16-bit words, as previously described. The 16-bit words have been interconnected by vertical and horizontal discretionary leads to form words consisting of a word driver and up to 64 bits. In the specific example, only 32 bits of memory were required for each word, so the fourth memory array section 96 was not utilized and only 11 bits are used from sections 90 and 92 and only 10 bits are used from section 94. Such redundancy of memory cells allows a wide variety of unique memories to be interconnected from a single basic wafer 10. The word driver circuits are provided in the area designated generally by the numeral 97. Areas on the wafer designated generally by the numerals 98 and 100 illustrate the use of discretionary wiring to bypass defective cells.

In order to clearly illustrate the steps employed by the present method, FIG. 9 is a process diagram for the fabrication of an integrated circuit array according to the invention. The semiconductor wafer is diffused at step 102 and then the first level metal leads are deposited and etched at step 104. At process step 106, insulation is deposited over the first level leads and feedthrough holes are etched through the insulation. Metallized feedthrough contacts and test pads are then deposited and etched upon the insulation.

The good and bad cells are then determined at process step 108 according to the automatic testing process steps 110. The discretionary lead pattern is determined at step 112, in accordance with the predetermined specification of the required array function developed at step 114. The unique mask is fabricated at step 116 by the mask generation system and then the second level metal leads are deposited and etched in accordance with the unique mask at step 118. The interconnected slice is then tested at step 120 to determine the suitability of the system function. The slice is assembled and packaged at step 122, and then the completed package is finally tested for the ultimate system function at step 124.

The present invention thus provides a method for providing very dense, high-yield integrated circuit systems. With the utilization of testing and discretionary wiring techniques at the second metallization layer, yield problems at the second level are substantially eliminated to provide improved yield. It will be understood that such discretionary wiring according to the present method may be done at higher levels of complexity, such as utilizing several discretionary interconnection steps or several layers of interconnecting patterns.

It should also be understood that the invention is not limited to multilevel discretionary wiring, but that the present method may be advantageously used in the selection of one suitable fixed second level interconnection pattern from a plurality of stored different interconnection patterns. Further, the present method may be utilized in the determination of the proper placement of a fixed pattern capable of a number of different orientations. Additionally, the testing steps of the invention are not limited to mechanical probing, but may be conducted by other devices such as thermal or field scanning systems.

Whereas the present invention has been described with respect to a specific embodiment thereof, it is to be understood that various changes and modifications may be suggested to one skilled in the art, and it is contemplated that the appended claims will cover any such changes and modifications that fall within the true scope of the invention.

What is claimed is:

1. A method of fabricating an integrated circuit system, the method consisting of the steps of:

a. forming an insulating layer having openings therein on a substrate, said substrate including a plurality of functional circuit cells and a first pattern of electrically conductive leads contacting said functional cells;
b. forming a pattern of feedthrough connectors covering portions of said insulating layer with each of said connectors contacting said first pattern of electrically conductive leads through said openings;
c. testing said functional cells and said feedthrough connectors by applying predetermined signals to said feedthrough connectors; and
d. selectively connecting a portion of said functional cells meeting predetermined functional standards to form said integrated circuit system by forming on said insulating layer a second pattern of electrically conductive leads selectively contacting said feedthrough connectors.

2. A method of fabricating an integrated circuit system, the method consisting of the steps of:

a. selectively forming a plurality of circuit elements in a substrate;
b. selectively interconnecting said circuit elements with a first pattern of electrically conductive leads to form functional cells;
c. forming an insulating layer covering portions of said substrate and portions of said first pattern of electrically conductive leads, said insulating layer having openings therein exposing portions of said first pattern of electrically conductive leads;
d. forming a plurality of feedthrough connectors covering portions of said insulating layer and contacting said first pattern of electrically conductive leads through said openings in said insulating layer;
e. testing said functional circuits by applying predetermined signals to said feedthrough connectors; and
f. selectively interconnecting said feedthrough connectors to form said integrated circuit system.

3. A process for fabricating an integrated circuit system, the process consisting of the steps of:

a. forming an insulating layer having openings therein on the surface of a unitary substrate structure, said substrate structure including circuit elements formed by selectively doping a semiconductor material and a first pattern of electrically conductive leads interconnecting said circuit elements to form a plurality of individual functional cells;
b. forming a plurality of feedthrough connectors covering portions of said insulating layer and extending through said openings such that said feedthrough connectors selectively contact said first pattern of electrically conductive leads;
c. testing said functional cells and said feedthrough connectors by applying predetermined signals to said feedthrough connectors; and
d. forming a second pattern of electrically conductive leads on the surface of said insulating layer such that selected feedthrough connectors and the functional cells associated therewith are interconnected to form said integrated circuit system.

* * * * *